(12) United States Patent
Gao et al.

(10) Patent No.: US 8,253,408 B2
(45) Date of Patent: Aug. 28, 2012

(54) METHOD FOR MEASURING HEARING AID COMPATIBILITY

(75) Inventors: Xu Gao, Beijing (CN); Zhi-Jun Zhang, Beijing (CN); Zheng-He Feng, Beijing (CN); Steven-Philip Marcher, Beijing (CN); Zhan Li, Beijing (CN); Yong Yan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 285 days.

(21) Appl. No.: 12/770,977

(22) Filed: Apr. 30, 2010

(65) Prior Publication Data
US 2011/0101961 A1    May 5, 2011

(51) Int. Cl.
*G01R 1/06* (2006.01)

(52) U.S. Cl. ...................................................... 324/149
(58) Field of Classification Search ................... 324/149
See application file for complete search history.

(56) References Cited

U.S. PATENT DOCUMENTS

| | | | |
|---|---|---|---|
| 2007/0003088 A1* | 1/2007 | Lehtola | 381/330 |
| 2009/0124306 A1* | 5/2009 | Kim et al. | 455/575.1 |
| 2010/0103068 A1* | 4/2010 | Chen et al. | 343/841 |
| 2011/0101962 A1* | 5/2011 | Gao et al. | 324/149 |

* cited by examiner

*Primary Examiner* — Thomas Valone
(74) *Attorney, Agent, or Firm* — Altis Law Group, Inc.

(57) ABSTRACT

A method for measuring hearing aid compatibility (HAC) includes providing a probe and scanning testing points of a testing region obtained by the probe. The probe includes a circuit board, an electric field detecting probe, and a magnetic field detecting probe. The electric field detecting probe and the magnetic field detecting probe are located on the circuit board.

20 Claims, 8 Drawing Sheets

METHOD FOR MEASURING HEARING AID COMPATIBILITY

CROSS-REFERENCE

This application claims all benefits accruing under 35 U.S.C. §119 from China Patent Application No. 200910110161.5, filed on Oct. 30, 2009 in the China Intellectual Property Office, the disclosure of which is incorporated herein by reference. This application is related to copending applications Ser. No. 12/770,990 entitled, "PROBE", filed Apr. 30, 2010 and Ser. No. 12/782,822 "HIGH-IMPEDANCE LINE AND DETECTING SYSTEM HAVING THE SAME", filed May 19, 2010.

BACKGROUND

1. Technical Field

The present disclosure relates to testing methods, especially to a method for measuring hearing aid compatibility (HAC).

2. Description of Related Art

The Federal Communications Commission (FCC) has established significant new regulations requiring that mobile handsets be hearing aid compatible. The regulations use ANSI C63.19 as the measurement method and criteria for determining hearing aid compatibility (HAC). To evaluate radio frequency compliance of a wireless communications device earpiece (WD earpiece), near-field measurements can be made in the vicinity of the WD earpiece, using an electric field probe and a magnetic field probe. In the measurement method, the electric field probe and the magnetic field probe scan a 50 by 50 millimeter region close to the WD earpiece separately. After a parameter of the electric field is detected by the electric field probe, the electric field probe should be replaced by the magnetic field probe to detect a parameter of the magnetic field. However, the magnetic field probe needs to be adjusted. Thus, the replacement and calibration steps increase measurement time and inefficient.

What is needed, therefore, is to provide a method for measuring the HAC with high efficiency.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
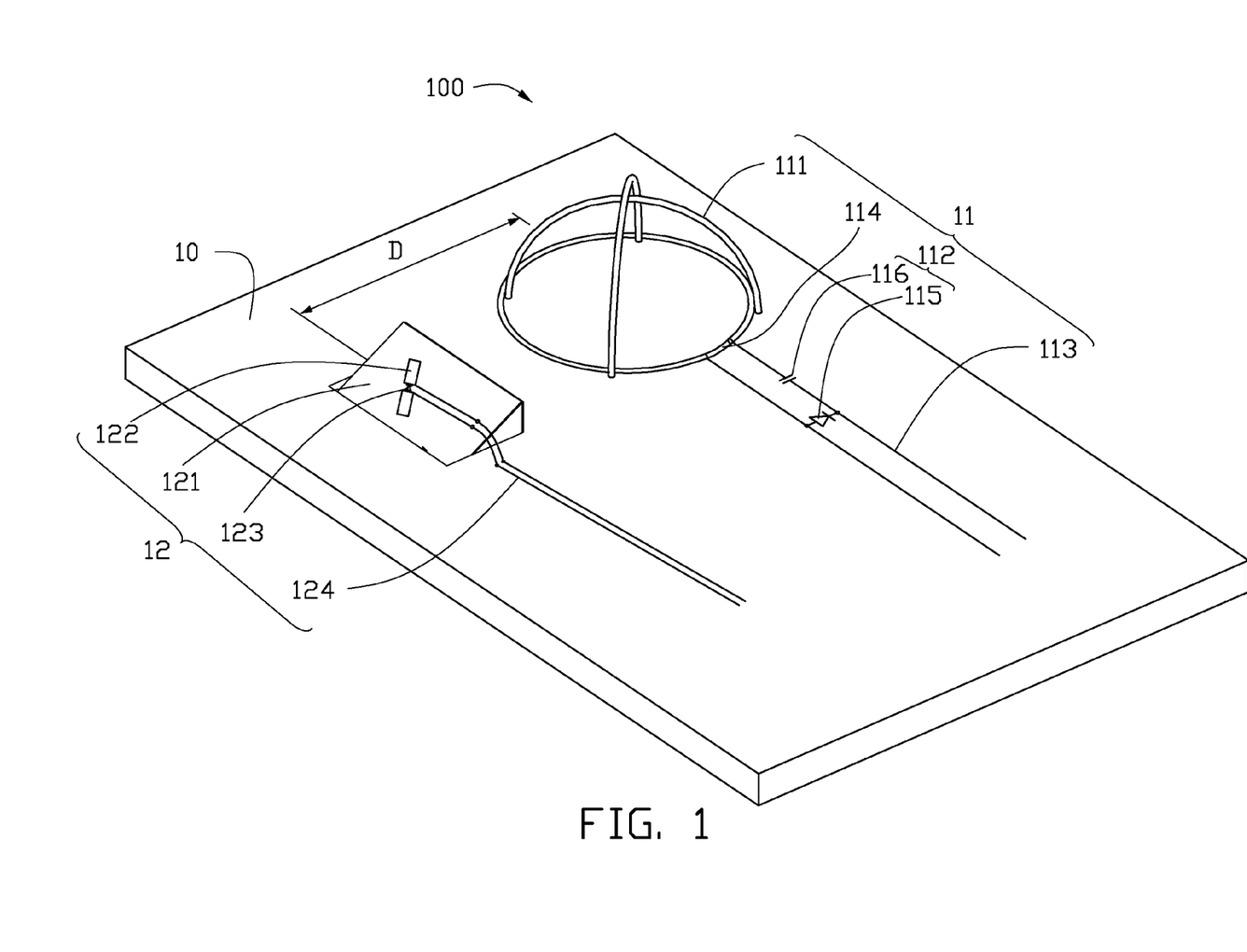
FIG. 1 is a schematic structural view of an embodiment of a probe.
Figure 2:
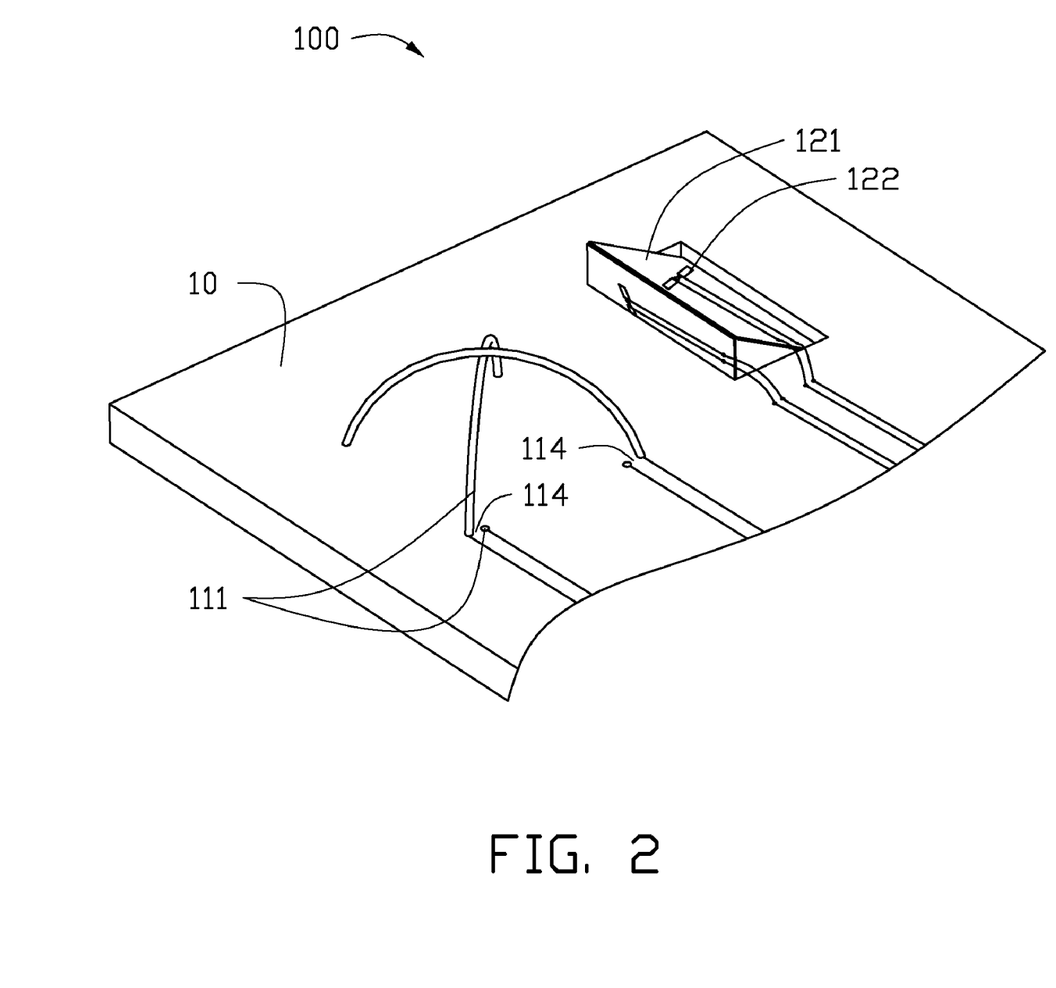
FIG. 2 is a schematic partial structural view of the probe of FIG. 1, shown from another aspect.

A method for measuring hearing aid compatibility (HAC) of an embodiment includes the following steps:

In a step S10, referring to FIG. 1 and FIG. 2, a probe 100 is provided. The probe includes a circuit board 10, an electric field detecting probe 12 and a magnetic field detecting probe 11, wherein the magnetic field detecting probe 11 and the electric filed detecting probe 12 are located on the circuit board. An anti jamming distance D between the two detecting probes 11 and 12 can be a multiple of 5 millimeters and greater than or equal to 10 millimeters;

In a step S20, a signal source is provided and a region, a 50 by 50 square millimeter region for example, is defined. The geometric center of the signal source overlaps with the geometric center of the region;

In a step S30, the region can be divided into sub-regions, for example, one hundred 5*5 square millimeters sub-regions by 11 longitudinal lines and 11 latitudinal lines; and In a step S40, all intersection points formed by the longitudinal and latitudinal lines are scanned using the two detecting probes 11 and 12, and electric field strengths and magnetic field strengths obtained by the two detecting probes 11 and 12 are recorded.

Figure 3:
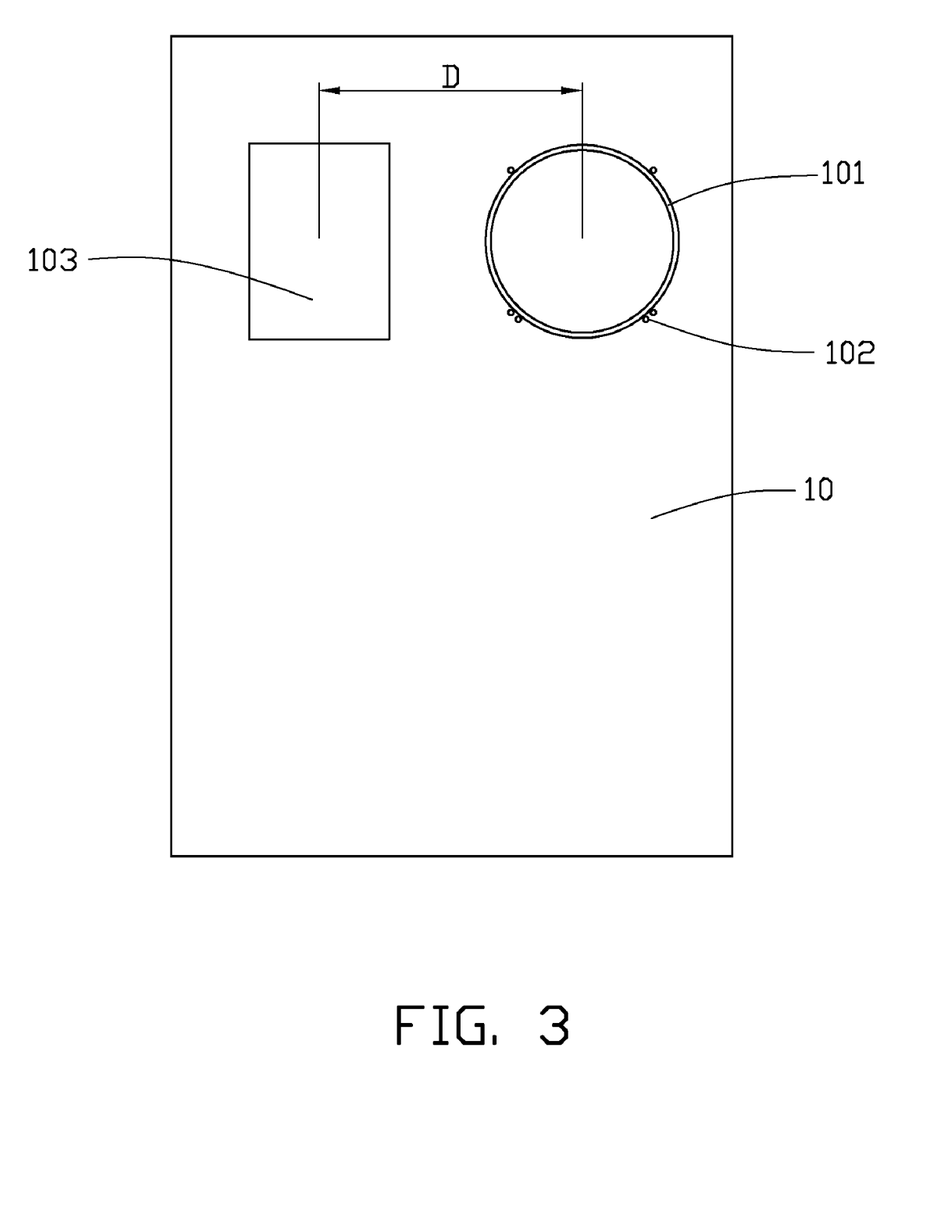
FIG. 3 is a schematic structural view of an embodiment of a circuit board of the probe.

Referring to FIG. 3, in step S10, the magnetic field detecting probe 11 and the electric field detecting probe 12 are disposed on the circuit board 10. The circuit board 10 can be a panel or a printed circuit board (PCB). The circuit board 10 has a top surface and a bottom surface to support electrical elements such as the detecting probes 11 and 12 thereon. The circuit board 10 can include a circular groove 101, six fixing holes 102, and an opening 103 at the top surface. The six fixing holes 102 and the opening 103 are defined through the circuit board 10. The magnetic field detecting probe 11 can be fixed on the circuit board 10 by the groove 101 and the fixing holes 102. The electric field detecting probe 12 can be fixed on the circuit board 10 by the opening 103. A diameter D1 of the groove 101 can be less than about 10 millimeters. In one embodiment, the diameter D1 of the groove 101 is about 6 millimeters. The shape of the opening 103 can be rectangle, elliptical, or triangular shaped. A distance L between the geometric center of the opening 103 and a fringe/edge of the opening 103 can be less than about 5 millimeters. In one embodiment, the opening 103 is a rectangle shaped opening, and the distance L between the geometric center of the opening 103 and the fringe/edge of the opening 103 is about 3 millimeters. A distance between the geometric centers of the groove 101 and the opening 103 can be substantially equal to the anti jamming distance D.

Figure 4:
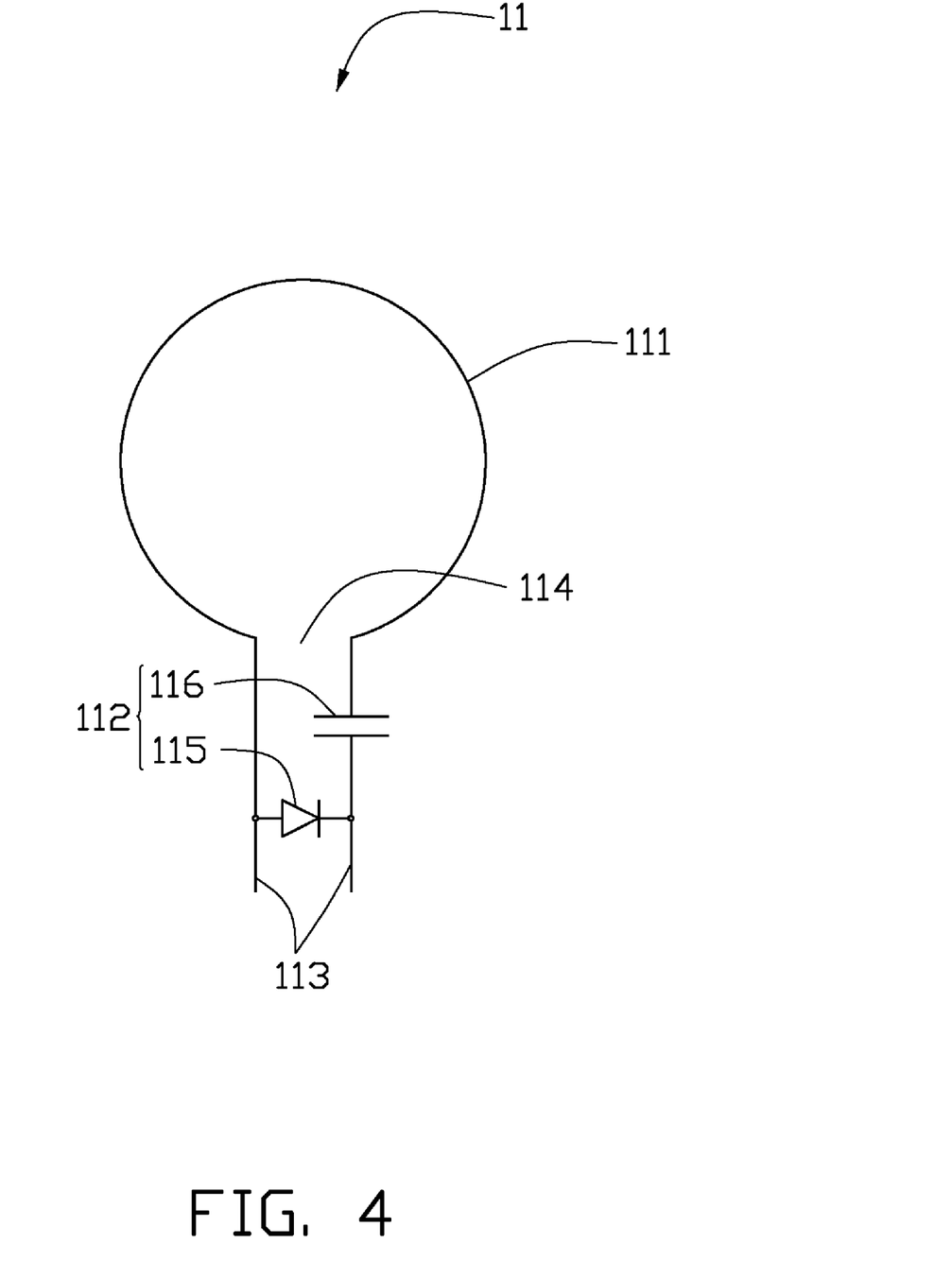
FIG. 4 is a schematic structural view of an embodiment of a magnetic field detecting probe of the probe.

Referring to FIGS. 1-2 and 4, the magnetic field detecting probe 11 can include three mutually orthogonal loops 111, three first demodulation circuits 112, and three pairs of first high-impedance transmission lines 113. The first demodulation circuits 112 can be electrically connected to the first loops 111 and the first high-impedance transmission lines 113. The first demodulation circuits 112 and the first high-impedance transmission lines 113 can be disposed on either the top surface or the bottom surface of the circuit board 10. In one embodiment, one first demodulation circuit 112 and one first high-impedance transmission line 113 are disposed on the top surface as shown in FIG. 1, and the other two first demodulation circuits 112 and two first high-impedance transmission lines 113 are disposed on the bottom surface.

The three loops 111 can be mutually orthogonal and rotate about its geometric center to detect signals in the three orthogonal axes. The loops 111 can have substantially equal diameters. The geometric centers of the loops 111 substantially lie on a common axis. The shape of the loops 111 can be circular, square, elliptical, triangular or other shapes. In one embodiment, the loops 111 are circular loops each having a diameter of about 6 millimeters. The circular loops 111 with a determined length can surround the largest acreage and can obtain the largest flux. A material of the loops 111 can be a metallic material such as gold, silver, nickel, copper, or other metallic material. The loops 111 can be connected in parallel. The three loops 111 can be kept insulated from each other by separating intersecting portions of two loops 111 or filling an insulation material between the intersecting portions of two loops 111. The insulation material can be for example, rubber or paint. Each of the loops 111 can have a cut 114 thereby forming two opposite outputting ends thereon. One of the loops 111 can be substantially parallel to the top surface of the circuit board 10 and be disposed on the circuit board 10. The other two loops 111 can be substantially perpendicular to the circuit board 10, and the cuts 114 of the two loops 111 can be close to the circuit board 10. In one embodiment, the loop 111 is substantially parallel to the circuit board 10 and engaged in the groove 101; and other two loops 111 are substantially perpendicular to the circuit board 10 and fixed on the circuit board 10 by extending through the fixing holes 102.

Each of the first demodulation circuits 112 can be electrically connected to the two outputting ends of one loop 111. Each of the first demodulation circuits 112 can include a first demodulation diode 115 and a capacitor 116. The first demodulation diode 115 and the capacitor 116 can be connected in series as show in FIG. 4. The first demodulation diode 115 is capable of filtering transmitted radio frequency signals (RF signals) thereby passing low frequency signals and shielding high frequency signals. The first demodulation circuits 112 can be configured for extracting signal envelopes from the RF signals detected by the loops 111. The RF signals can be amplitude modulation signals, frequency modulation signals, or combination thereof. In one embodiment, the RF signals are modulation signals radiated from an antenna of a wireless communications device such as GSM mobile or CDMA mobile. The amplitude modulation signals can be high frequency signals loading low frequency signals. If the amplitude modulation signals are transmitted by the first demodulation diode 115, a negative part of the low frequency signals can be cut to obtain a positive part of the low frequency signals. The positive part of the low frequency signals can be the signal envelopes of the magnetic field strengths of the signal source.

The high-impedance lines 113 can be configured for transmitting signal envelopes obtained by the first demodulation circuits 112 to a signal processing device. The signal processing device can be an analog-digital converter (ADC), a central processing unit (CPU), or other data-processing equipment. The high-impedance lines 113 can be capable of shielding high frequency signals of the signal envelopes.

The detailed structure of the magnetic field detecting probe 11 has been described above. The magnetic field detecting probe 11 can also be divided into three units. Each unit is defined by one orthogonal loop 111, one first demodulation circuit 112, and one pair of the first high-impedance transmission lines 113. In each unit, one end of the first demodulation diode 115 connected to one outputting end of the orthogonal loop 111. The opposite end of the first demodulation diode 115 connects to the other outputting end of the orthogonal loop 111. The capacitor 116 connects between the opposite end of the first demodulation diode 115 and the other outputting end of the orthogonal loop 111. one first high-impedance transmission line 113 connects one end of the first demodulation diode 115, The other first high-impedance transmission line 113 connects to the opposite end of the first demodulation diode 115.

Figure 5:
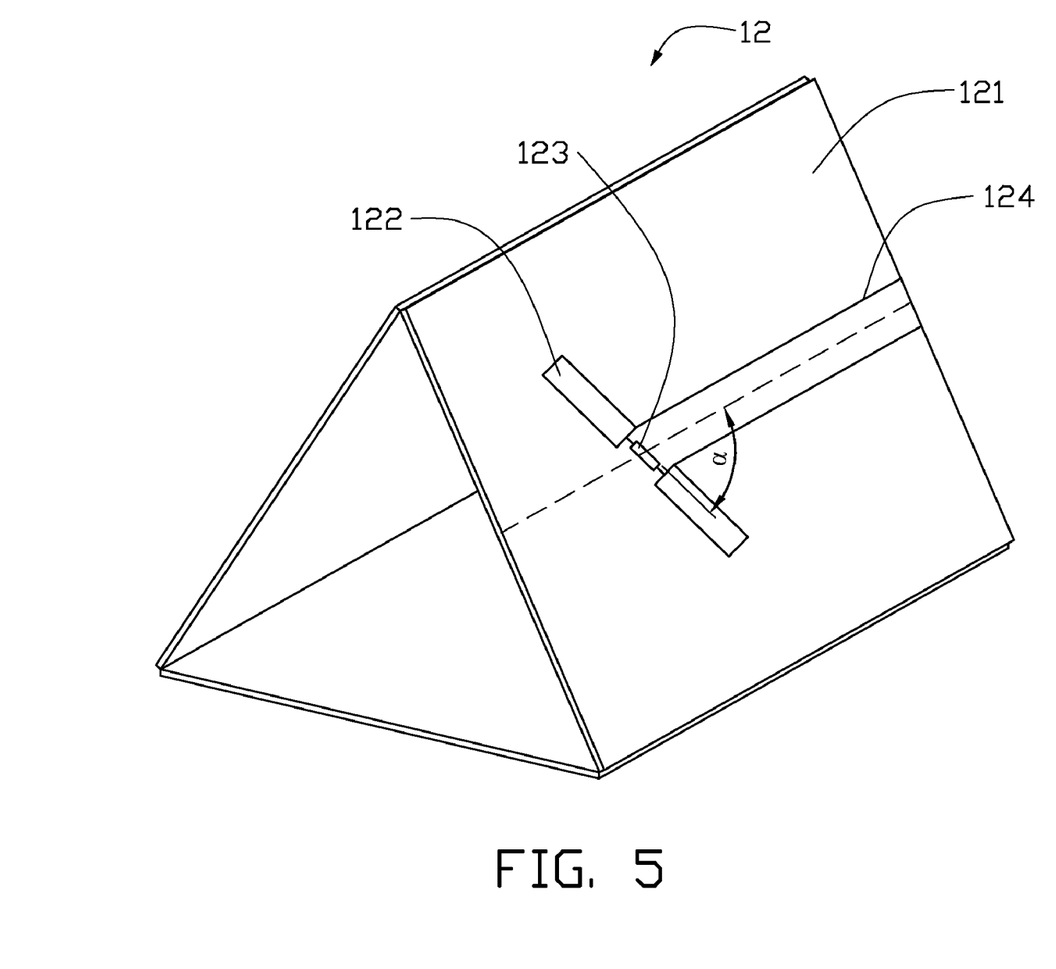
FIG. 5 is a schematic structural view of an embodiment of an electric field detecting probe of the probe.

Referring to FIG. 2 and FIG. 5, the electric field detecting probe 12 can include a supporting element 121, three mutually orthogonal dipoles 122 disposed on the supporting element 121, three second demodulation circuits 123, and three second high-impedance transmission lines 124. The second demodulation circuits 123 can be electrically connected to the dipoles 122 and the second high-impedance transmission lines 124. The second demodulation circuits 123 and the second high-impedance transmission lines 124 can be disposed on either the top surface or the bottom surface of the circuit board 10. In on embodiment, one second demodulation circuit 123 and one second high-impedance transmission line 124 are disposed on the top surface as shown in FIG. 1, and the other two second demodulation circuits 123 and two second high-impedance transmission lines 124 are disposed on the bottom surface as shown in FIG. 2.

The supporting element 121 can be fixed on the circuit board 10 by extending through the opening 103. The supporting element 121 can be a hollow rhombus-like structure formed by three panels connecting end to end. A cross-section of the supporting element 121 can be an equilateral triangle. One panel of the supporting element 121 can be substantially perpendicular to the circuit board 10, thus the symmetry axis of the supporting element 121 can be substantially parallel to the circuit board 10.

Figure 6:
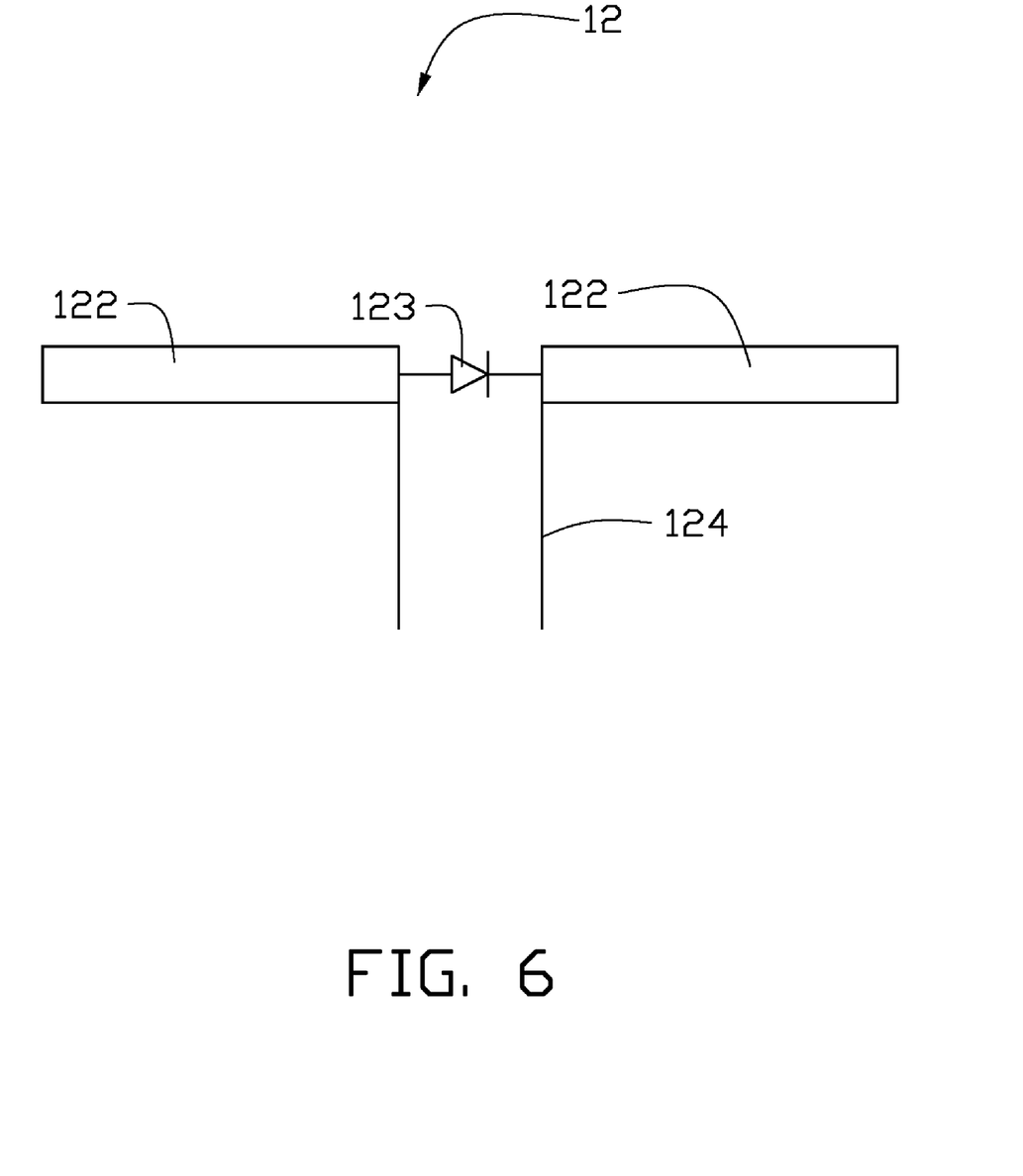
FIG. 6 is a circuit diagram of an embodiment of the electric field detecting probe.

Referring to FIG. 6, the dipoles 122 can be configured for measuring electric field strengths. Each of the dipoles 122 can be a pair of equal and opposite poles separated by a small distance. A length of each of the dipoles 122 can be less than 7 millimeters. A length of each of the poles can be less than about 3 millimeters. In one embodiment, the length of the dipole 122 is about 6 millimeters, and the length of the pole is about 2.5 millimeters. The three dipoles 122 can form a symmetrical structure. The geometric center of the symmetrical structure can substantially lie on the center axis of the supporting element 121. An angle α between the center axis of the supporting element 121 and the center axis of the dipoles 122 can be about 54.7 degrees. A material of the dipoles 122 can be a metallic material such as gold, silver, nickel, copper, and so on.

The anti jamming distance D is usually a distance between the geometric center of the symmetric structure formed by the three dipoles 122 and the geometric center of the loops 111. When the probe 100 is in operation, the anti jamming distance D between the electric field detecting probe 11 and the magnetic field detecting probe 12 can ensure the probe 100 works properly. For example, the electric field detecting probe 11 and the magnetic field detecting probe 12 can work together if the anti jamming distance D is greater than or equal to 10 millimeters. In one embodiment, the anti-jamming distance D is about 10 millimeters. It should be noted that the anti jamming distance D between the two detecting probes 11 and 12 is designed according to regulations, such as using ANSI C63.19 as the measurement method and criteria for hearing aid compatibility (HAC).

The function of the second demodulation circuits 123 can be similar to the first demodulation circuits 112. Each of the second demodulation circuits 123 can include a second demodulation diode electrically connected between the two poles of the dipoles 122.

The function and the structure of the second high-impedance lines 124 can be similar to the first high-impedance lines 113. Each of the second high-impedance lines 124 can include two transmission lines electrically connected to two opposite ends of the second demodulation diode.

In step S20, the signal source can be a wireless communications device earpiece or other RF signal source. The region can be a testing region defined by the ANSI C63.19 measurement standard. In one embodiment, the region is a planar square region.

Figure 7:
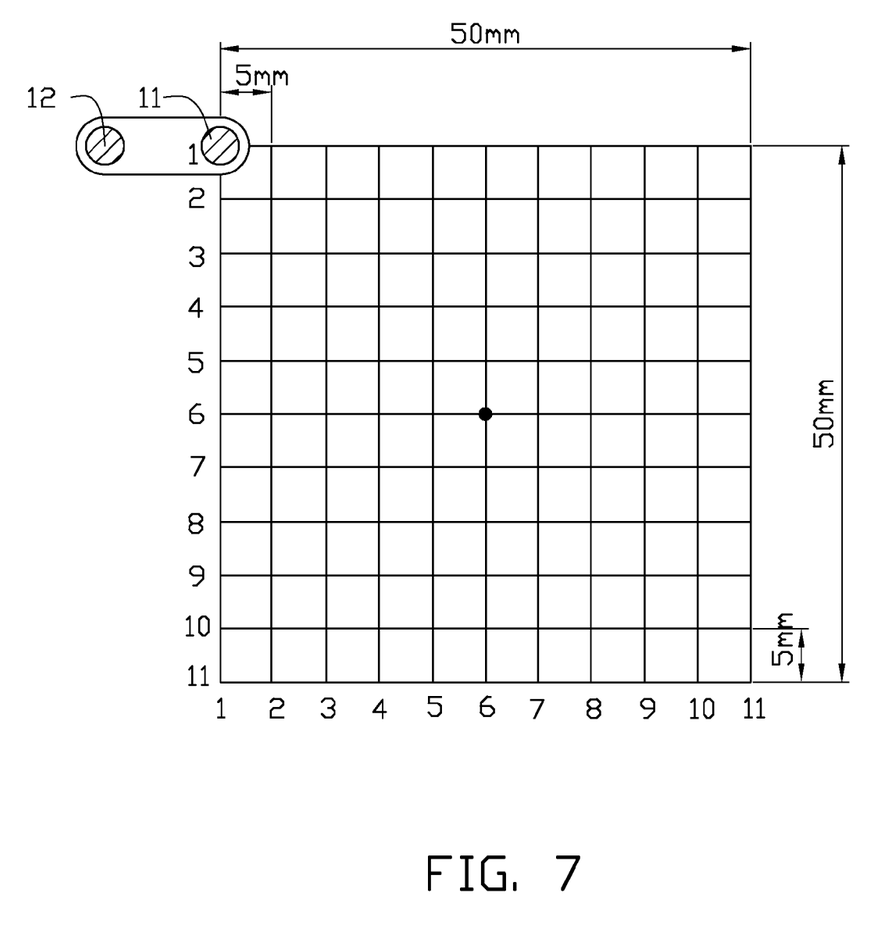
FIG. 7 is an embodiment of a region.

Referring to FIG. 7, in step S30, the region can be evenly divided by the longitudinal lines and the latitudinal lines of the sub-regions can be substantially the same. The 11 longitudinal lines can be labeled longitudinal line (1, 2 ... 10, 11) respectively; and the latitudinal lines can be labeled latitudinal line (1, 2 ... 10, 11) respectively as shown in FIG. 7. 121 intersection points can be formed by the longitudinal lines and the latitudinal lines. Coordinates of the intersection points can be defined as (1, 1), (1, 2) ... (11, 10), (11, 11) by the longitudinal lines and the latitudinal lines. Alternatively, the intersection points can be testing points defined by the ANSI C63.19 measurement standard.

Figure 8:
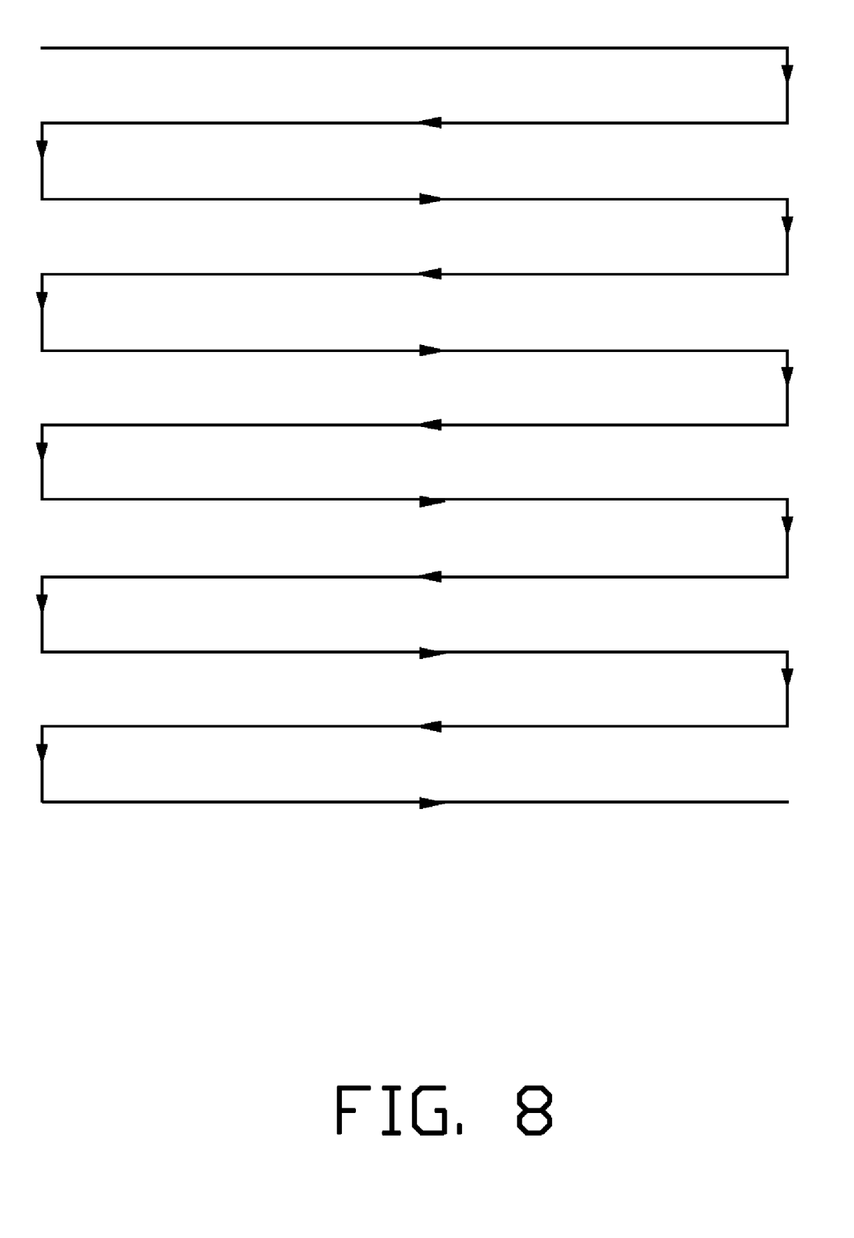
FIG. 8 is an embodiment of a route of the probe moving in the region of FIG. 7.

In step S40, means for scanning the intersection points is not limited. In one embodiment, a connection axis connecting the geometric centers of the two detecting probes 11 and 12 can be substantially parallel to the longitudinal lines or the latitudinal lines. In one embodiment, a route of the probe 100 moving in the region can be shown in FIG. 8. The probe 100 can be operated according to the steps of:

S41, moving the probe 100 into the region and ensuring the connection axis is substantially parallel to the longitudinal lines;

S42, positing one of the detecting probes 11 and 12 to intersection point (1, 1) formed by a first of the longitudinal lines and a first of the latitudinal lines;

S43, moving the probe (10+X) steps along the first longitudinal line;

S44, moving the probe 100 ten steps along a direction substantially parallel to the latitudinal lines, wherein the probe 100 moves (10+X) steps along a direction substantially parallel to the longitudinal lines between two steps of the ten steps.

In step S42, the electric field detecting probe 12 can be posited out of the region, if the magnetic field detecting probe 11 can be posited to the intersection (1, 1). Alternatively, the magnetic field detecting probe 11 can be posited out of the region, if the electric field detecting probe 12 can be posited to the intersection point (1, 1).

In step S43, a distance of one step can be about 5 millimeters. The parameter X can be a multiple formed by the anti jamming distance D and 5 millimeters: X=D/5. Both of the magnetic field detecting probe 11 and the electric field detecting probe 12 can move into the region, if the probe 100 moves X steps along a direction substantially parallel to the longitudinal lines. In one embodiment, the anti jamming distance D is about 10 millimeters and the parameter X is 2. Thus, both of the magnetic field detecting probe 11 and the electric field detecting probe 12 can move into the region, if the probe 100 moves 2 steps along the direction substantially parallel to the longitudinal lines. For example, the magnetic field detecting probe 11 can be posited on intersection point (1, 3) and the electric field detecting probe 12 can be posited on intersection point (1, 1). Simultaneously, the magnetic field detecting probe 11 can move out of the region and the electric field detecting probe 12 can be posited on intersection point (1, 11), if the probe 100 moves 11 steps.

In step S44, the probe 100 can move along two adjacent longitudinal lines in opposite directions.

The method for measuring hearing aid compatibility (HAC) can further include step S50, calculating the HAC of the signal source through the electric field strengths and the magnetic field strengths. In step S50, means for calculating the HAC can follow the method supplied by the ANSI C63.19 measurement standard.

If one of the detecting probes 11 or 12, is posited on intersection point (m, n), the other of the detecting probes 11 or 12, can be posited on intersection point (m, n+X). The parameter m is an integer greater than 0 and less than 12, the parameter n is an integer greater than 0 and less than 10, and the parameter X is a multiple formed by the anti jamming distance D and 5 millimeters. Thus, the probe 100 can obtain the electric field strengths and the magnetic field strengths in the same time in most of the intersection points, and decrease time for measuring hearing aid compatibility (HAC). For example, if the parameter X is equal to 2, the probe 100 can obtain the electric field strengths and the magnetic field strengths in the same time in 99 intersection points. Furthermore, the magnetic field detecting probe 11 and the electric field detecting probe 12 can be mounted together on the circuit board 10. Thus, time for replacing the electric field detecting probe 12 or the magnetic field detecting probe 11 can be omitted.

One embodiment of a method for measuring hearing aid compatibility (HAC) includes the following steps:

In step S210, referring to FIG. 1 and FIG. 2, providing a probe 100 comprising a circuit board 10, an electric field detecting probe 12, and a magnetic field detecting probe 11. The electric field detecting probe 12 and the magnetic field detecting probe 11 are disposed on the circuit board 10, and the anti jamming distance D between the two detecting probes 11 and 12, being a multiple of 5 millimeters and being greater than or equal to 10 millimeters;

S220, providing a signal source and defining a 50 by 50 square millimeter region, the geometric center of the signal source overlapping with the geometric center of the region;

S230, dividing the region into one hundred 5 by 5 square millimeters sub-regions by 11 longitudinal lines and 11 latitudinal lines; and S240, scanning all intersection points formed by the longitudinal lines and latitudinal lines using the two detecting probes 11 and 12, and recording electric field strengths and magnetic field strengths obtained by the two detecting probes 11 and 12.

In step S240, means for scanning the intersection points is not limited. In one embodiment, a connection axis connecting the geometric centers of the two detecting probes 11 and 12 can be substantially parallel to the longitudinal lines or the latitudinal lines. In one embodiment, the probe 100 can be operated according to the steps of:

S241, moving the probe 100 into the region and ensuring the connection axis parallel to the latitudinal lines;

S242, positing one of the detecting probes 11 or 12 to intersection point (1, 1) formed by a first longitudinal line of the longitudinal lines and a first latitudinal line of the latitudinal lines S243, moving the probe 100 ten steps along the first longitudinal line 1;

S244, moving the probe 100 (10+X) steps along a direction substantially parallel to the latitudinal lines, wherein the probe 100 moves 10 steps along a direction substantially parallel to the longitudinal lines between two steps of the (10+X) steps.

In step S242, the electric field detecting probe 12 can be posited out of the region, if the magnetic field detecting probe 11 can be posited to the intersection (1, 1). Alternatively, the magnetic field detecting probe 11 can be posited out of the region, if the electric field detecting probe 12 can be posited to the intersection point (1, 1).

In step S243, a distance of one step can be about 5 millimeters. The parameter X can be a multiple formed by the anti jamming distance D and 5 millimeters. Both the magnetic field detecting probe 11 and the electric field detecting probe 12 can move into the region, if the probe 100 moved X steps along a direction substantially parallel to the latitudinal lines. In one embodiment, the anti jamming distance D is about 10 millimeters and the parameter X is 2. Thus, both of the magnetic field detecting probe 11 and the electric field detecting probe 12 can move into the region, if the probe 100 moved 2 steps along the direction substantially parallel to the latitudinal lines. For example, the magnetic field detecting probe 11 can be posited on intersection point (1, 3) and the electric field detecting probe 12 can be posited on intersection point (3, 1). Simultaneously, the magnetic field detecting probe 11 can move out of the region and the electric field detecting probe 12 can be posited on intersection point (11, 1), if the probe 100 moved 11 steps.

The method for measuring hearing aid compatibility (HAC) can further include step S250, calculating the HAC of the signal source through the electric field strengths and the magnetic field strengths.

One embodiment of a method for measuring hearing aid compatibility (HAC) includes the following steps:

S310, providing an electric field detecting probe and a magnetic field detecting probe cooperatively mounted on a circuit board, wherein a distance between the electric field detecting probe and the magnetic field detecting probe is a multiple of 5 millimeters and is greater than or equal to 10 millimeters; and S320, scanning testing points of a testing region and recording electric field strengths and magnetic field strengths obtained by the electric field detecting probe and the magnetic field detecting probe.

One embodiment of a method for measuring HAC includes the following steps:

S410, an electric field detecting probe and a magnetic field detecting probe cooperatively mounted on a circuit board are provided, and a distance between the electric field detecting probe and the magnetic field detecting probe can be greater than or equal to 10 millimeters; and S420, testing points of a testing region are scanned by the electric field detecting probe and the magnetic field detecting probe, and electric field strengths and magnetic field strengths can be obtained and recorded.

In step S420, the testing region can be divided into a plurality of sub-regions by a plurality of longitudinal lines and a plurality of latitudinal lines, and the testing points can be intersection points formed by the longitudinal lines and latitudinal lines. If distances between adjacent testing points can be substantially equal to each other, the distance between the electric field detecting probe and the magnetic field detecting probe can be a multiple of the distance between two adjacent testing points. Thus, the probe can obtain the electric field strengths and the magnetic field strengths at the same time in most of the testing points, and decrease time for measuring HAC.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the disclosure. Variations may be made to the embodiments without departing from the spirit of the disclosure as claimed. Elements associated with any of the above embodiments are envisioned to be associated with any other embodiments. The above-described embodiments illustrate the scope of the disclosure but do not restrict the scope of the disclosure.

What is claimed is:

1. A method for measuring hearing aid compatibility (HAC), comprising:
   providing a probe comprising a circuit board, an electric field detecting probe and a magnetic field detecting probe, wherein the electric field detecting probe and the magnetic field detecting probe are located on the circuit board, and an anti jamming distance between the two detecting probes is a multiple of 5 millimeters and is greater than about 10 millimeters;
   providing a signal source and defining a 50 by 50 square millimeter region, a geometric center of the signal source overlapping with a geometric center of the region;
   dividing the region into one hundred 5 by 5 square millimeter sub-regions by 11 longitudinal lines and 11 latitudinal lines;
   scanning all intersection points formed by the longitudinal lines and latitudinal lines using the two detecting probes; and
   recording electric field strengths and magnetic field strengths obtained by the two detecting probes.

2. The method as claimed in claim 1, wherein a connection axis connecting the geometric centers of the two detecting probes is substantially parallel to the longitudinal lines or the latitudinal lines, when the step of scanning is carried out.

3. The method as claimed in claim 2, wherein in the step of scanning, the probe is operated by:
   moving the probe into the region and ensuring the connection axis substantially parallel to the longitudinal lines;
   positing one of the detecting probes to an intersection point (1, 1) formed by a first longitudinal line of the longitudinal lines and a first latitudinal line of the latitudinal lines;
   moving the probe (10+X) steps along the first longitudinal line 1; and
   moving the probe 10 steps along a direction substantially parallel to the latitudinal lines, wherein the probe moves (10+X) steps along a direction substantially parallel to the longitudinal lines between two steps of the ten steps;
   wherein the parameter X is a multiple formed by the anti jamming distance and 5 millimeters.

4. The method as claimed in claim 3, wherein the probe moves along opposite directions in two adjacent longitudinal lines.

5. The method as claimed in claim 3, wherein a distance of one step is substantially equal to 5 millimeters.

6. The method as claimed in claim 2, wherein in the step of scanning, the probe is operated by:
   moving the probe into the region and ensuring the connection axis is parallel to the latitudinal lines;

positing one of the detecting probes to an intersection point (1, 1) formed by a first longitudinal line of the longitudinal lines and a first latitudinal line of the latitudinal lines;

moving the probe 10 steps along the first longitudinal line 1; and moving the probe (10+X) steps along a direction substantially parallel to the latitudinal lines, wherein the probe moves 10 steps along a direction substantially parallel to the longitudinal lines between two steps of the (10+X) steps;

wherein the parameter X is a multiple formed by the anti jamming distance and 5 millimeters.

7. The method as claimed in claim 6, wherein the probe moves along two adjacent longitudinal lines in opposite directions.

8. The method as claimed in claim 6, wherein a distance of one step is about 5 millimeters.

9. The method as claimed in claim 1, wherein the probe obtains an electric field strength and a magnetic field strength, when one of the detecting probes is posited on intersection point (m, n) and the other of the detecting probes is posited on intersection point (m, n+X), wherein the parameter m is an integer greater than 0 and less than 12, the parameter n is an integer greater than 0 and less than 10, and the parameter X is a multiple formed by the anti jamming distance and 5 millimeters.

10. The method as claimed in claim 1, wherein the magnetic field detecting probe comprises three mutually orthogonal loops, the loops being insulated from each other.

11. The method as claimed in claim 10, wherein each of the loops is electrically connected to a first demodulation circuit.

12. The method as claimed in claim 1, wherein the electric field detecting probe comprises three mutually orthogonal dipoles, the mutually orthogonal dipoles being insulated from each other.

13. The method as claimed in claim 12, wherein the electric field detecting probe further comprises a supporting element having three sidewalls, the dipoles being disposed on the sidewalls.

14. The method as claimed in claim 13, wherein a cross-section of the supporting element is an equilateral triangle, and an angle between the axis line of the supporting element and the axis of one dipole is about 54.7 degrees.

15. The method as claimed in claim 1, further comprising:
calculating the HAC of the signal source through the electric field strengths and the magnetic field strengths.

16. A method for measuring hearing aid compatibility (HAC), comprising:
providing an electric field detecting probe and a magnetic field detecting probe cooperatively mounted on a circuit board, a distance between the electric field detecting probe and the magnetic field detecting probe being a multiple of 5 millimeters and being greater than or equal to 10 millimeters; and
scanning testing points of a testing region and recording electric field strengths and magnetic field strengths obtained by the electric field detecting probe and the magnetic field detecting probe.

17. A method for measuring hearing aid compatibility (HAC), comprising:
providing an electric field detecting probe and a magnetic field detecting probe cooperatively mounted on a circuit board, a distance between the electric field detecting probe and the magnetic field detecting probe being greater than or equal to 10 millimeters; and
scanning testing points of a testing region and recording electric field strengths and magnetic field strengths obtained by the electric field detecting probe and the magnetic field detecting probe.

18. The method as claimed in claim 17, wherein distances between adjacent testing points are substantially equal to each other.

19. The method as claimed in claim 18, wherein the distance between the electric field detecting probe and the magnetic field detecting probe is a multiple of the distance between two adjacent testing points.

20. The method as claimed in claim 17, wherein the testing region is divided into a plurality of sub-regions by a plurality of longitudinal lines and a plurality of latitudinal lines, the testing points are consist of intersection points formed by the longitudinal lines and latitudinal lines.

* * * * *

UNITED STATES PATENT AND TRADEMARK OFFICE
CERTIFICATE OF CORRECTION

PATENT NO. : 8,253,408 B2  
APPLICATION NO. : 12/770977  
DATED : August 28, 2012  
INVENTOR(S) : Gao et al.

Page 1 of 1

It is certified that error appears in the above-identified patent and that said Letters Patent is hereby corrected as shown below:

Title Page, below Item (65) insert

-- [30]     Foreign Application Priority Data

Oct. 30, 2009   (CN) ........................200910110161.5 --

Signed and Sealed this
Twenty-ninth Day of October, 2013

Teresa Stanek Rea
*Deputy Director of the United States Patent and Trademark Office*